US005597781A

United States Patent [19]
Sheng et al.

[11] Patent Number: 5,597,781
[45] Date of Patent: *Jan. 28, 1997

[54] R-TL-SR-CA-CU-O SUPERCONDUCTORS AND PROCESSES FOR MAKING SAME

[75] Inventors: Zhengzhi Sheng; Allen M. Hermann, both of Fayetteville, Ark.

[73] Assignee: University of Arkansas, Little Rock, Ark.

[*] Notice: The portion of the term of this patent subsequent to Jul. 30, 2008, has been disclaimed.

[21] Appl. No.: 480,258

[22] Filed: Feb. 15, 1990

Related U.S. Application Data

[63] Continuation of Ser. No. 251,348, Sep. 29, 1988, Pat. No. 5,036,044.

[51] Int. Cl.$^6$ .......................... H01B 12/00; H01L 39/12
[52] U.S. Cl. .................... 505/120; 505/783; 252/518; 252/521
[58] Field of Search ................ 505/783, 1; 252/518, 252/521

[56] References Cited

U.S. PATENT DOCUMENTS

| | | | |
|---|---|---|---|
| 4,755,493 | 7/1988 | Takeuchi et al. | 505/134 |
| 4,870,052 | 9/1989 | Engler et al. | 505/1 |
| 4,880,773 | 11/1989 | Itozuki | 252/521 |

FOREIGN PATENT DOCUMENTS

| | | |
|---|---|---|
| 0284062 | 9/1988 | European Pat. Off. |
| 0280812 | 9/1988 | European Pat. Off. |

OTHER PUBLICATIONS

Kishio "High–Tc Superconducting Oxide Solid Solutions . . . " *Chemistry Letters.* 1987 pp. 635–638.
Kaneko "On the coprecipitation method for the prep . . . " *Jap. Jul. Appl. Physics* v. 26 (5) May 1987 pp. L734–735.
Oda "Oxygen Deficiency in $YM_2CU_3O_{7+y}$(M=Ba,Sr) Family" *Jap. Jnl. Appl. Phys.* v. 26(5) May 1987 pp. L804–L806.
Wada "Annealing Effect of High–Tc Superconducting . . . " *Jap. Jnl. Appl. Phys.* v. 26(9) Sep. 1987 pp. L1475–L1477.
Nagashima "Superconductivity in $Tl_{1.5}SrCaCu_2O_x$," *Jap. Jnl. Appl. Phys.* v. 27(6) Jun. 1988 pp. L1077–L1079.
Haldar "A new intermediate–Tl oxide superconductor . . . " *Materials Letters.* v. 7(1,2) Aug. 1988 pp. 1–4.
Hasegawa, T., et al., *High T. Superconductivity of $(La_{1-x}Sr_xCuO_4$ —Effect of Substition . . . Superconductivity,* Japan Journal of Applied Physics, vol. 26, No. 4, Apr. 20, 1987, L337–L338.
Kishio, K., et al., *Effect of Lanthanide Ion Substitutions for Lanthanum Sites on Superconidcutivity of $(La_{1-x}Sr_x)_2CuO_{4-\delta}$,* Japanese Journal of Applied Physics, vol. 26, No. 4, Apr. 20, 1987, L391–L393.
Ohshima, S., et al., *Superconducting and Structural Properties of the New $Ba_{1-x}Ln_xCu)_{3-x}$Compound System (Ln=La, Ce, Pr, Nd, Sm, Eu, . . . and Yb),* Japanese Journal of Applied Physics, vol. 26 No. 5, May 1987, L815–L817.
Tsurumi, S., et al., *High T. Superconductivities of $A_2Ba_4Cu_6O_{14+y}$* Japanese Journal of Applied Physics, vol. 26, No. 5, May 1987, L856–L857.
*Superconductivity News,* vol. 1, No. 2, Aug. 1987, pp. 1, 2, and 6–8.
Yang, K. N., et al., *High Temperature Superconductivity in Rare–Earth (R)–Barium Copper Oxides $(RBa_2)Cu_3O_{9-\delta}$,* Solid State Communications, vol. 63, No. 6, 1987, pp. 515–519.

(List continued on next page.)

*Primary Examiner*—Paul Lieberman
*Assistant Examiner*—M. Kopec
*Attorney, Agent, or Firm*—Hill, Steadman & Simpson

[57] ABSTRACT

A high temperature superconductor system is provided having the following formula: M-A-B-C-D-E, wherein M is a metallic element. A is an element in Group 3A, B is an element in Group 2A, C is another element in Group 2A, D is an element in Group 1B, and E is an element in Group 6A. In an embodiment, the high temperature superconductor has the following formula: R-Tl-Sr-Ca-Cu-O (wherein R is chosen form the group consisting of La, Pr, Nd, Sm, Eu, Gd, Tb, Dy, Ho, Er, Tm, Yb, Lu, and Y). Processes for making these high temperature superconductors are also disclosed.

4 Claims, 3 Drawing Sheets

OTHER PUBLICATIONS

Tarascon, J. M., et al., *Oxygen and Rare–Earth Doping of the 90–K Superconducting Perovskite* $YBa_2Cu_3O_{7-x}$, Physical Review B, vol. 36, No. 1, 1987, 226–234.

Hor, P. H., et al., *Superconductivity Above 90 K in the Square–Planar Compound System* $ABa_2Cu_3O_{6+x}$ *with A=Y, La, Nd, Sm, Eu, Gd, Ho, Er, and Lu*, Physical Review Leters, vol. 58, No. 18, 1987, 1891–1894.

Khurana, A., *Superconductivity Seen Above the Boiling Point of Nitrogen*, Physics Today, Apr., 1987, 17–23.

Cava, R. J., et al., *Bulk Superconductivity at 91 K in Single–Phase Oxygen–Deficient Perovskite* $Ba_2YCu_3O_{9-\delta}$, Physical Review Letters, vol. 58, No. 16, 1987, 1676–1679.

Saito, Y., et al. *High–$T_c$ Superconducting Properties in* $(Y_{1-x}Tl_x)Ba_2Cu_3O_{7-y}$, $Y(Ba_{1-x}K_x)_2Cu_3O_{7-y}$ and $YBa_2(Cu_{1-x}Mg_x)_3O_{7-y}$, Physica 148B, 1987, 336–338.

Kondoh, S., et al., *Superconductivity in Tl–Ba–Cu–O System*, Solid State Communications, Vol. 65, No. 11, 1988, 1329–1331.

Sera, M. et al., *On the Structure of High–$T_c$ Oxide System Tl–Ba–Cu–O*, Institute for Molecular Science, Myodaiji, Okazaki 444 Japan, 1988.

Ihara, H. et al., *Possibility of Superconductivity of 65° C. in Sr–Ba–Y–Cu–O System*, Japanese Journal of Applied Physics, vol. 26, No. 8, Aug., 1987, L1413–L1415.

Ishida, T., *Compositional Variation of High* $T_c$ *in* $Yb_xEr_{1-x}Ba_2Cu_3O_{6+y}$ *System*, Japanese Journal of Applied Physics, vol. 26, No. 8, Aug., 1987, L1294–L1295.

Kijima, T., et al., *Superconductivity in the Bi–Sr–La–Cu–O System*, Japanese Journal of Applied Physics, vol. 27, No. 6, Jun., 1988, L1035–L1037.

Richert, B., et al., *Atomic Substitution in* $YBa_2CU_3O_7$: *Modification of the Electronic Structure*, American Institute of Physics Conference Proceedings No. 165 (Thin Film Processing and Characterization of High–Temperature Superconductors), Nov. 6, 1987, 227–283.

Ferreira, J. M., et al., *Long–range Magnetic Ordering the High–$T_c$ Superconductors* $RBa_2Cu_3O_{7-\delta}$ (R=Nd, Sm, Gd, Dy and Er), Physical Review B, vol. 37, No. 4, Feb. 1, 1988, 2368–2371.

Shih, I., et al., *Multilayer Deposition of Thallium Barium Calcium Copper Oxide Films*, Applied Physics Letter 53(6), 1988, 523–525.

Ginley, D. S., et al., *Sequential Electron Beam Evaporated Films of* $Tl_2CaBa_2Cu_2O_y$ *with Zero resistance at 97 K*, Applied Physics Letters, 53 (5), Aug. 1, 1988, 406–408.

Qui, C. X., et al., *Formation of Tl–CA–Ba–Cu–O Films by Diffusion of Tl into rf–sputtered Ca–Ba–Cu–O*, Applied Physics Letters, 53 (12), Sep. 19, 1988, 1122–1124.

Gopalakrishnan, I. K., et al., *Synthesis and Properties of a 125 K Superconductor in the Tl–Ca–Ba–Cu–O System*, Applied Physics Letters, 53 (5), Aug. 1, 1988, 414–416.

Parkin, S. S. P., et al., *Bulk Superconductivity at 125 K in* $Tl_2Ca_2Ba_2Cu_3O_x$, Physical Review, 1988, 2539–2542.

Sheng, Z. Z., et al., *Superconductivity in the Rare–Earth––Free Tl–Ba–Cu–O System Above Liquid–Nitrogen Temperature*, Nature, vol. 332, Mar. 3., 1988, 55–58.

Sheng, Z. Z., et al., *Superconductivity at 90 K in the Tl–Ba–Cu–O System.*, Physical Review Letters, vol. 60, No. 10, Mar. 7, 1988, 937–940.

Sheng, Z. Z., et al., *Bulk Superconductivity at 120 K in the Tl–Ca/Ba–Cu–O System*, Nature, vol. 332, Mar. 10, 1988, 138–139.

Ihara, H., et al., *A New High–$T_c$* $TlBa_2Ca_3Cu_4O_{11}$ *Superconductor with* $T_c>120$ K, Nature, vol. 334 11 Aug. 1988, 510–511.

Hazen, R. M., et al., *100–K Superconducting Phases in the Tl–Ca–Ba–Cu–O System*, Physical Review Letters, vol. 60, No. 16, 18 Apr. 1988, 1657–1660.

Sheng, Z. Z., et al., *New 120 K Tl–Ca–Ba–Cu–O Superconductor*, Appl. Phys. Lett., vol. 52, No. 20, 16 May 1988, 1738–1740.

Hatta, S., et al., *Pt–coated Substrate Effect on Oxide Superconductive Films in Low–Temperature Processing*, Appl. Phys. Lett. 53 (2), 11 Jul. 1988, 148–150.

Lee, W. Y., et al, *Superconducting Tl–Ca–Ba–Cu–O Thin Films With Zero Resistance at Temperatures of up to 120 K*, Appl. Phys. Lett 53 (4), 25 Jul. 1988, 329–331.

Iwazumi, T., et al., *Identification of a Structure with Two Superconducting Phases in L–Ba–Cu–0 System (L=La or Y)*, Japanese Journal of Applied Physics, vol. 26, No. 5, May, 1987, L621–L623.Capone, II., D. W., et al., *Super Critical Fields and High Superconducting Transition Temperatures of* $La_{1.85}Sr_{0.15}CuO_4$ and $La_{1.85}Ba_{0.15}Cu_4$, Appl. Phys. Lett 50 (9), 2 Mar., 1987, 543–544.

Johnson, D. W., et al., *Fabrication of Ceramic Articles from High* $T_c$ *Superconducting Oxides*, Materials Research Society, Symposium S Proceedings (High Temperature Superconductors), Apr. 1987, 193–195.

Garwin, L., *Superconducting Conference Yields New Temperature Record*, Nature vol. 332 10 Mar. 1988.

Suzuki, A., et al., *Rare– Earth(RE)—Barium Solubility Behavior in* $Y(Ba_{z-x}RE_x)Cu_3O_{7=\delta}$ and $Sm(Ba_{z-x}RE_x)Cu_3O_{7=\delta}$, Japanese Journal of Applied Physics, vol. 27, No. 5, May, 1988, L792–L794.

Peters, P. N., et al., *Observation of Enhanced Properties in Samples of Silver Oxide Doped* $YBa_2Cu_3O_x$, Applied Phys. Lett 52 (24), 13 Jun. 1988, 2066–2067.

S. Natarajan et al., *Superconductivity Studies on* $(Y_{1-x}Ln_x)Ba_2Cu_3O_7$, *Ln=La,Pr,Tb*, Physica C, vol. 153–155, Feb. 1988, 926–927.

D. D. Sarma, et al., *Electronic Structure of High–$T_c$ Superconductors from Soft–x–ray Absorption*, Physical Review B, vol. 37, No. 16, Jun. 1988, 9784–9787.

K. Kishio, et al., *Superconductivity Achieved at Over Liquid Nitrogen Temperature by (Mixed Rare Earths)–Ba–Cu Oxides*, Japanese Journal of Applied Physics, vol. 26 No. 5, May 1987, L694–L696.

Waldrop, M. Mitchell, *Thallium Superconductor Reaches 125K*, Research News, Mar. 1988, 1243.

Qadri, S. B., et al., *X–ray Identification of the Superconducting High–$T_c$ Phase in the Y–Ba–Cu–O System*, Physical Review B, vol. 35, No. 13, 1987.

Murphy, D. W., et al., *New Superconducting Cuprate Perovskites*, Physical Review Letters, vol. 58, May 1987, 1888–1890.

R-TL-SR-CA-CU-O SUPERCONDUCTORS AND PROCESSES FOR MAKING SAME

This is a continuation of application Ser. No. 251,348, filed Sep. 29, 1988, now U.S. Pat. No. 5,036,044.

The present invention relates generally to high temperature superconductors. More specifically, the present invention relates to a new high temperature superconductor system and processes for making same.

A variety of superconducting systems are known. The inventors of the present patent application have filed the following patent applications that disclose superconductors and/or methods of making same.

U.S. patent application Ser. No. 144,144 discloses a high temperature superconductor having the composition Tl-R-X-Y wherein: R is an element chosen from Group 2A; X is an element chosen from Group 1B; and Y is an element chosen from Group 6A.

U.S. patent application Ser. No. 155,247 discloses a high temperature superconductor having the composition: Tl-R-Ba-Cu-O wherein R is a Group 2A element excluding barium; or Tl-Sr-Cu-O. In an embodiment, R is either strontium or calcium.

U.S. patent application Ser. No. 082,222 discloses a high temperature superconductor having the composition: Tb-R-Ba-Cu-O wherein R is chosen from the group of rare earth metals excluding: praseodymium; cerium; and terbium.

U.S. patent application Ser. No. 089,067 discloses a high temperature superconductor having the composition: R-Ba-Cu-O wherein R is chosen from the group of rare earth metals excluding: praseodymium; terbium; and cerium.

U.S. patent application Ser. No. 236,502 discloses a process for making Tl-Ba-Ca-Cu-O superconductors.

Applicants have also filed, on the same day as the instant patent application, a patent application entitled: "Tl-Sr-Ca-Cu-O SUPERCONDUCTORS AND PROCESSES FORM MAKING SAME". The patent application discloses a high temperature superconductor having the formula Tl-Sr-Ca-Cu-O and processes for making same.

A new superconductor would be desirable for many reasons. Such a superconductor would: (1) facilitate the discovery of the correct theory on oxide superconductivity; (2) provide a framework for the search for higher temperature, even room temperature superconductors; (3) allow superconducting components to operate with lower cost; and (4) provide low cost processing and manufacturability. Furthermore, in superconducting systems including Tl, there is a drawback in that Tl is toxic. Therefore, a superconducting system with a reduced amount of Tl would be desirable.

Accordingly, there is a need for new high temperature superconductors.

SUMMARY OF THE INVENTION

The present invention provides a new superconductor system that yields a number of new high temperature superconductors with transition temperatures above liquid nitrogen temperature that are unique to date among all high temperature superconductors.

The present invention comprise a system containing six elements:

M-A-B-C-D-E wherein:
M, A, B, C, and D are metallic elements; and
E is a non-metallic element.

Preferably, M is a metallic element, A is an element in Group 3A, B, and C are elements in Group 2A, D is an element in Group 1B, and E is an element in Group 6A.

In a preferred embodiment, M is a rare earth, including La, Pr, Nd, Sm, Eu, Gd, Tb, Dy, Ho, Er, Tm, Yb, Lu, and Y; A is thallium (Tl); B is strontium (Sr); C is calcium (Ca); D is copper (Cu); and E is oxygen (O).

In an embodiment, the superconductor of the present invention has the following formula:

Pr-Tl-Sr-Ca-Cu-O.

In an embodiment, the superconductor of the present invention has the following formula:

Tb-Tl-Sr-Ca-Cu-O.

In an embodiment, the superconductor of the present invention has the following approximate stoichiometry:

$RTl_xSr_yCa_zCu_uO_v$ wherein:
x is greater than 0.1 and less than 10;
y is greater than or equal to 0 and less than or equal to 10;
z is greater than or equal to 0 and less than or equal to 10;
y+z is greater than 0.1 and less than 20;
u is greater than 0.1 and less than 20;
v is greater than x+y+z+u and less than 5+x+y+z+u; and
R is a rare earth metal.

Methods for producing the high temperature superconductors of the present invention are also provided. The methods allow the superconductors to be prepared at temperatures of approximately 850° to about 1000° C. in flowing oxygen.

Accordingly, an advantage of the present invention is to provide a number of new superconducting systems having high transition temperatures.

A further advantage of the present invention is to provide a number of material systems that may produce higher temperature, even room temperature superconductors.

A still further advantage of the present invention is that is provides a number of new high temperature superconductors that can be rapidly fabricated.

Furthermore, an advantage of the present invention is that it provides processes for making new high temperature superconductors.

Still another advantage of the present invention is that it provides processes for rapidly making high temperature superconductors.

Additional features and advantages of the present invention will be apparent from the detailed description of the presently preferred embodiments and from the drawings.

DETAILED DESCRIPTION OF THE PRESENTLY PREFERRED EMBODIMENTS

Figure 1:
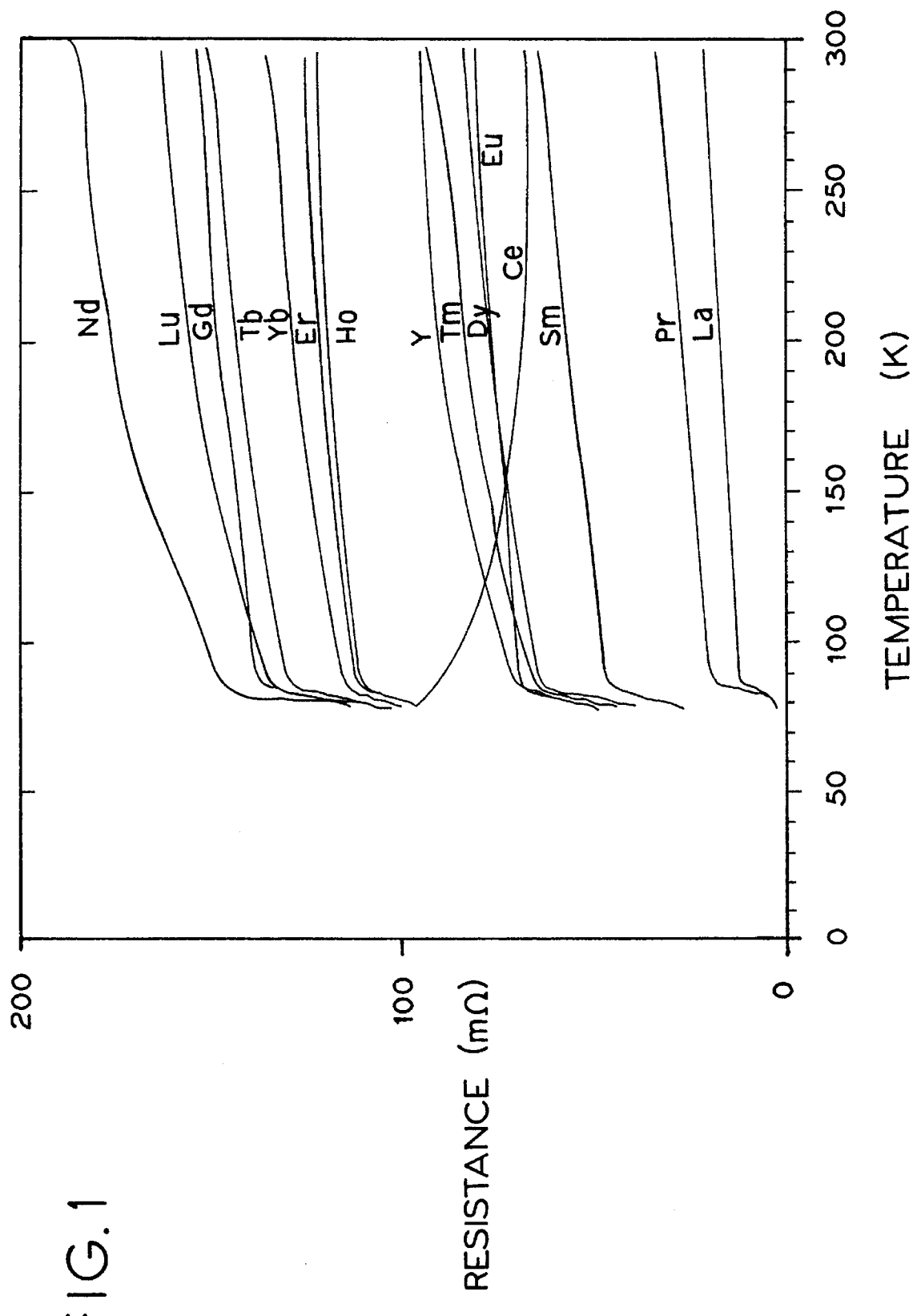
FIG. 1 illustrates graphically ac (5 KHz) resistance versus temperature for nominal $RTl_2Sr_2Ca_2Cu_3O_{12}$ samples with R=La, Ce, Pr, Nd, Sm, Eu, Gd, Tb, Dy, Ho, Er, Tm, Yb, Lu, and Y.

The present invention provides a new superconductor system that provides a number of new superconductors with phases whose transition temperatures are above liquid nitrogen temperature. The present invention also provides a number of new material systems that may produce higher temperature, even room temperature superconductors by further elemental substituion and variation of preparation procedures. In addition, the present invention provides processes for making these new high temperature superconductors.

The present invention comprises a superconducting system containing six elements:

M-A-B-C-D-E wherein:
M, A, B, C, and D are metallic elements; and
E is a non-metallic element.

Preferably, M is a metallic element, A is an element in Group 3A, B and C are elements in Group 2A, D is an element in Group 1B, and E is an element in Group 6A.

In a preferred embodiment, M is a rare earth (including La, Pr, Nd, Sm, Eu, Gd, Tb, Dy, Ho, Er, Tm, Yb, Lu, and Y), A is thallium, B is strontium (Sr), C is calcium (Ca), D is copper (Cu), and E is oxygen (O).

In a preferred embodiment, the superconductor of the present invention has the following formula:

R-Tl-Sr-Ca-Cu-O wherein: R=La, Pr, Nd, Sm, Eu, Gd, Tb, Dy, Ho, Er, Tm, Yb, Lu, and Y.

The inventors of the present invention have found that superconductors having this formula are superconducting above liquid nitrogen temperature. To date, the following above-liquid-nitrogen-temperature superconducting systems are known: rare earth-Ba-Cu-O (90K); Tl-Ba-Cu-O (90K); Bi-Sr-Ca-Cu-O (110K); and Tl-Ba-Ca-Cu-O (120K). The R-Tl-Sr-Ca-Cu-O systems of the present invention are the fifth above-liquid-nitrogen-temperature superconducting systems.

The present invention provides a number of new supercondutors that can be operated at higher temperature with lower cost. Furthermore, the new high temperature superconductors of the present invention can be rapidly produced.

In a preferred embodiment, the superconductors in the new superconductive systems having the following approximate stoichiometry:

$RTl_xSr_yCa_zCu_uO_v$ wherein:
x is greater than 0 and less than 10;
y is greater than or equal to 0 and less than or equal to 10;
z is greater than or equal to 0 and less than or equal to 10;
y+z is greater than 0.1 and less than 20;
u is greater than 0.1 and less than 20;
v is greater than x+y+z+u and less than 5+x+y+z+u; and
R is a rare earth metal.

By way of example and not limitation, examples of methods for making the new high temperature R-Tl-Sr-Ca-Cu-O superconductors will now be given.

EXAMPLE 1

A. The following reagents were utilized:
1. $La_2O_3$
2. $Tl_2O_3$
3. $SrCO_3$
4. $CaCO_3$
5. CuO B. The following procedure was followed:
1. A mixture of $SrCO_3$, $CaCO_3$, and CuO with a molar ratio of 2:2:3 was completely ground.
2. The mixture was heated at 950° C. in air for at least 24 hours with several intermediate grindings.
3. The heated mixture was cooled and ground, so that a powder with a nominal composition of $Sr_2Ca_2Cu_3O_7$ was obtained.
4. A mixture of $La_2O_3$, $Tl_2O_3$, and $Sr_2Ca_2Cu_3O_7$ with a molar ratio of 1:2:2:23 (La:Tl:Sr:Ca:Cu) was ground and pressed into a pellet.
5. A tube furnace was heated to 900° C. in flowing oxygen.
6. The pellet was put in a platinum boat, and the boat was placed in the tube furnace, maintaining the temperature and oxygen flow for 3 minutes.
7. The pellet was then furnace-cooled to room temperature.

The samples prepared by this procedure were found to be superconducting above liquid nitrogen temperature. The resistance-temperature dependence for a sample prepared pursuant to this example is shown in FIG. 1 (curva La) and FIG. 2 (curve La1). This sample reached zero resistance at liquid nitrogen temperature.

EXAMPLE 2

The procedure was the same as that set forth Example 1 except that $La_2O_3$ was replaced by $Pr_2O_3$.

Figure 2:
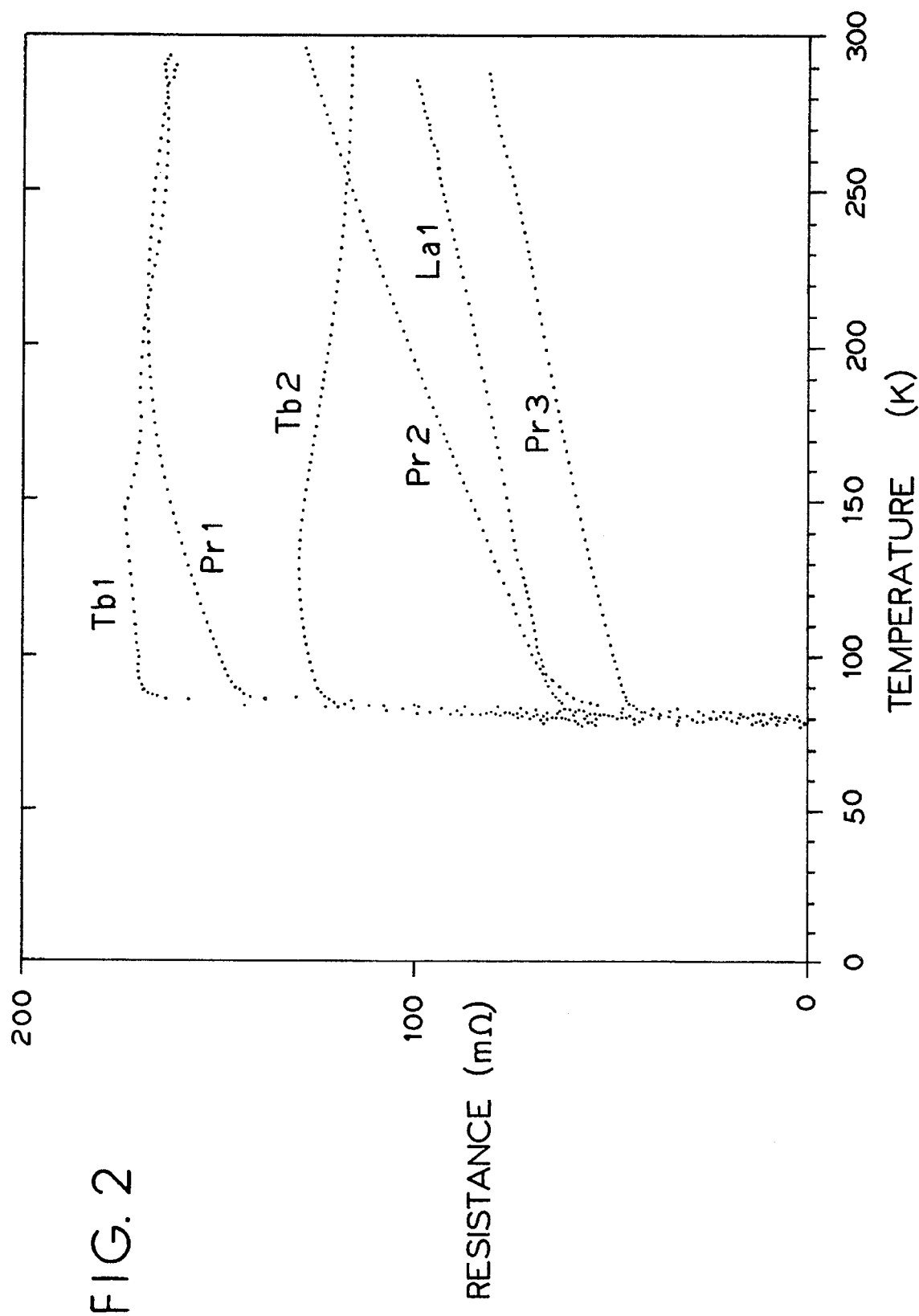
FIG. 2 illustrates graphically dc resistance versus temperature for La-Tl-Sr-Ca-Cu-O, Pr-Tl-Sr-Ca-Cu-O, and Tb-Tl-Sr-Ca-Cu-O samples.
Figure 3:
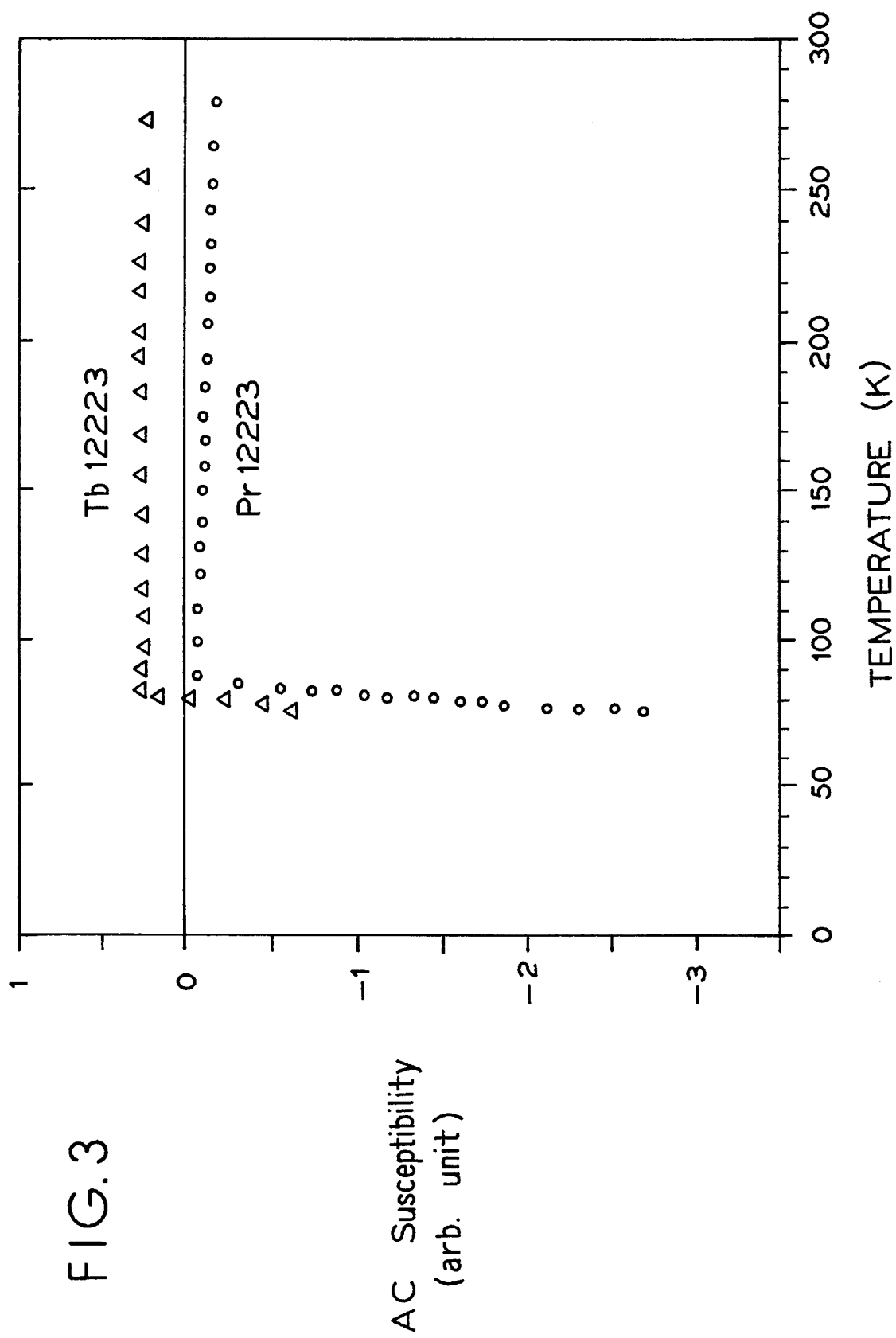
FIG. 3 illustrates graphically ac (5 KHz) susceptibility versus temperature dependencesfor a Pr-Tl-Sr-Ca-Cu-O sample and a Tb-Tl-Sr-Ca-Cu-O sample.

The samples prepared by this procedure were found to be superconducting above liquid nitrogen temperature. The resistance-temperature dependence for a sample prepared pursuant to this example illustrated in FIG. 1 (curve Pr) and FIG. 2 (curve Pr3). This ample reached zero resistance at liquid nitrogen temperature. FIG. 3 illustrates ac susceptibility-temperature dependence for this sample (curve Pr12223 in FIG. 3).

EXAMPLE 3

The same procedure as that used in Example 1 was followed except that $La_2O_3$ was replaced by $Nd_2O_3$.

The samples prepared by this procedure were found to be superconducting above liquid nitrogen temperature. The resistance-temperature dependence for a sample prepared pursuant to this example is illustrated in FIG. 1 (curve Nd).

EXAMPLE 4

The same procedure as that set forth in Example 1 was used except that $La_2O_3$ was replaced by $Sm_2O_3$.

The samples prepared by this procedure were found to be superconducting above liquid nitrogen temperature. The ac resistance-temperature dependence for a sample prepared pursuant to this example is illustrated in FIG. 1 (curve Sm).

EXAMPLE 5

The same procedure as that set forth in Example 1 was used except that $La_2O_3$ was replaced by $Eu_2O_3$.

EXAMPLE 6

The same procedure as that set forth in Example 1 was used except that $La_2O_3$ was replaced $Gd_2O_3$.

The samples prepared by this procedure were found to be superconducting above liquid nitrogen temperature. The resistance-temperature dependence for a sample prepared pursuant to this example is illustrated in FIG. 1 (curve Gd).

EXAMPLE 7

The same procedure as that set forth in Example 1 was followed except that $La_2O_3$ was replaced by $Tb_4O_7$.

The samples prepared by this procedure were found to be superconducting above liquid nitrogen temperature. The resistance-temperature dependence for a sample prepared pursuant to this example is illustrated in FIG. 1 (curve Tb). The ac susceptibility-temperature dependence for the sample is illustrated in FIG. 3 (curve Tb12223).

EXAMPLE 8

The same procedure as that set forth in Example 1 was followed except that $La_2O_3$ was replaced by $DY_2O_3$.

The sample prepared by this procedure were found to be superconducting above liquid nitrogen temperature. The resistant-temperature dependence for a sample prepared pursuant to this example is illustrated in FIG. 1 (curve Dy).

EXAMPLE 9

The same procedure as that set forth in Example 1 was followed except that $La_2O_3$ was replaced by $HO_2O_3$.

The samples prepared by this procedure were found to be superconducting above liquid nitrogen temperature. The resistance-temperature dependence for a sample prepared pursuant to this example is illustrated in FIG. 1 (curve Ho).

EXAMPLE 10

The same procedure as that set forth in Example 1 was followed except that $La_2O_3$ was replaced by $Er_2O_3$.

The samples prepared by this procedure were found to be superconducting above liquid temperature. The resistance-temperature dependence for a sample prepared pursuant to this example is illustrated in FIG. 1 (curve Er).

EXAMPLE 11

The same procedure as that set forth in Example 1 was followed except that $La_2O_3$ was replaced by $Tm_2O_3$.

The samples prepared by this procedure were found to be superconducting above liquid nitrogen temperature. The resistance-temperature dependence for a sample prepared pursuant to this example is illustrated in FIG. 1 (curve Tm).

EXAMPLE 12

The same procedure as that set forth in Example 1 was followed except that $La_2O_3$ was replaced by $Yb_2O_3$.

The samples prepared by this procedure were found to be superconducting above liquid nitrogen temperature. The resistance-temperature dependence for a sample prepared pursuant to this example is illustrated in FIG. 1 (curve Yb).

EXAMPLE 13

The same procedure as that set forth in Example 1 was followed except that $La_2O_3$ was replaced by $Lu_2O_3$.

The samples prepared by this procedure were found to be superconducting above liquid nitrogen temperature. The resistance-temperature dependence for a sample prepared pursuant to this example is illustrated in FIG. 1 (curve Lu).

EXAMPLE 14

The same procedure as that set forth in Example 1 was followed except that $La_2O_3$ was replaced by $Y_2O_3$.

The samples prepared by this procedure were found to be superconducting above liquid nitrogen temperature. The resistance-temperature dependence for a sample prepared pursuant to this example is illustrated in FIG. 1 (curve Y).

EXAMPLE 15

A. The following reagents were utilized:
1. $La_2O_3$
2. $Tl_2O_3$
3. $SrCO_3$
4. $CaCO_3$
5. CuO B. The following procedure was followed:
1. A mixture of $SrCO_3$, $CaCO_3$, and CuO with a molar ratio of 2:2:3 was completely ground.
2. The mixture was heated at 950° C. in air for at least 24 hours with several intermediate grindings.
3. The heated mixture was cooled and ground, so that a powder with a nominal composition of $Sr_2Ca_2Cu_3O_7$ was obtained.
4. A mixture of $La_2O_3$ and $Sr_2Ca_2Cu_3O_7$ with an atomic molar ratio of 1:2:2:3 (La:Sr:Ca:Cu) was ground and pressed into a pellet.
5. The pellet was heated at 950° C. in air or flowing oxygen for 3–10 minutes.
6. A tube furnace was heated to 900° C. in flowing oxygen.
7. 0.1 to about 0.2 gram of $Tl_2O_3$ was put in a platinum boat which was put in a quartz boat, and the heated pellet was put over the platinum boat.
8. The quartz boat and its contents was placed in the tube furnace, maintaining the temperature and oxygen flow for 2 to about 5 minutes.
9. the quartz boat with its contents was then furnace-cooled to room temperature.

The samples prepared by this procedure were found to be superconducting above liquid nitrogen temperature.

EXAMPLE 16

The same procedure as that set forth in Example 15 was followed except $La_2O_3$ was replaced by $Pr_2O_3$.

EXAMPLE 17

The same procedure as that set forth in Example 15 was followed except $La_2O_3$ was replaced by $Nd_2O_3$.

EXAMPLE 18

The same procedure as that set forth in Example 15 was followed except $La_2O_3$ was replaced by $Sm_2O_3$.

EXAMPLE 19

The same procedure as that set forth in Example 15 was followed except $La_2O_3$ was replaced by $Eu_2O_3$.

EXAMPLE 20

The same procedure as that set forth in Example 15 was followed except $La_2O_3$ was replaced by $Gd_2O_3$.

EXAMPLE 21

The same procedure as that set forth in Example 15 was followed except $La_2O_3$ was replaced by $Tb_4O_7$.

EXAMPLE 22

The same procedure as that set forth in Example 15 was followed except $La_2O_3$ was replaced by $Dy_2O_3$.

EXAMPLE 23

The same procedure as that set forth in Example 15 was followed except $La_2O_3$ was replaced by $HO_2O_3$.

EXAMPLE 24

The same procedure as that set forth in Example 15 was followed except $La_2O_3$ was replaced by $Er_2O_3$.

EXAMPLE 25

The same procedure as that set forth in Example 15 was followed except $La_2O_3$ was replaced by $Tm_2O_3$.

EXAMPLE 26

The same procured as that set fort in Example 15 was followed except $La_2O_3$ was replaced by $Yb_2O_3$.

EXAMPLE 27

The same procedure as that set forth in Example 15 was followed except $La_2O_3$ was replaced by $Lu_2O_3$.

EXAMPLE 28

The same procedure as that set forth in Example 15 was followed except $La_2O_3$ was replaced by $Y_2O_3$.

EXAMPLE 29

A. The following reagents were utilized:
1. $Pr_2O_3$
2. $Tl_2O_3$
3. $SrCO_3$
4. $CaCO_3$
5. $CuO$ B. The following procedure was followed:
1. A mixture of $SrCO_3$, $CaCO_3$, and $CuO$ with a molar ratio of 2:2:3 was completely ground.
2. The mixture was heated at 950° C. in air for at least 24 hours with several intermediate grindings.
3. The heated mixture was cooled and ground, so that a powder with a nominal composition of $Sr_2Ca_2Cu_3O_7$ was obtained.
4. A mixture of $Pr_2O_3$, $Tl_2O_3$, and $Sr_2Ca_2Cu_3O_7$ with an atomic molar ratio of 1:2:2:2:3 (Pr:Tl:Sr:Ca:Cu) was ground and pressed into a pellet.
5. A tube furnace was heated to 950° C. in flowing oxygen.
6. The pellet was put in a platinum boat, and the boat was placed in the tube furnace, maintaining the temperature and oxygen flow for 2 minutes.
7. The platinum boat with the pellet was then furnace-cooled to room temperature.

The samples prepared by this procedure were found to be superconducting above liquid nitrogen temperature. The dc resistance-temperature dependence for a sample prepared pursuant to this example is illustrated in FIG. 2 (curve Pr2). This sample reached zero resistance at liquid nitrogen temperature.

EXAMPLE 30

A. The following reagents were utilized:
1. $Pr_2O_3$
2. $Tl_2O_3$
3. $SrCO_3$
4. $CaCO_3$
5. $CuO$ B. The following procedure was followed:
1. A mixture of $SrCO_3$, $CaCO_3$, and $CuO$ with a molar ratio of 2:4:5 was completely ground.
2. The mixture was heated at 950° C. in air for at least 24 hours with several intermediate grindings.
3. The hated mixture was cooled and ground, so that a powder with a nominal composition of $Sr_2Ca_4Cu_5O_{11}$ was obtained.
4. A mixture of $Pr_2O_3$, $Tl_2O_3$, and $Sr_2Ca_4Cu_5O_{11}$ with an atomic molar ratio of 1:1:2:4:5 (Pr:Tl:Sr:Ca:Cu) was ground and pressed into a pellet.
5. A tube furnace was heated to 900° C. in flowing oxygen.
6. The pellet was put in a platinum boat, and the boat was placed in the tube furnace, maintaining the temperature and oxygen flow for 3 minutes.
7. The pellet was annealed at 710° C. in flowing oxygen for 10 hours, followed by furnace-cooling to room temperature.

The samples prepared by this procedure were found to be superconducting above liquid nitrogen temperature. The dc resistance-temperature dependence for a sample prepared pursuant to the method of this example is illustrated in FIG. 2 (curve Pr1).

EXAMPLE 31

The same procedure as that set forth in Example 30 was followed except that $Pr_2O_3$ was replaced by $Tb_4O_7$.

The samples prepared by this procedure were found to be superconducting above liquid nitrogen temperature. The dc resistance-temperature dependence for a sample prepared pursuant to the method of this example is illustrated in FIG. 2 (curve Tb2).

EXAMPLE 32

A. The following reagents were utilized:
1. $Tb_4O_7$
2. $Tl_2O_3$
3. $SrCO_3$
4. $CaCO_3$ 5. CuO B. The following procedure was followed:

1. A mixture of $SrCO_3$, $CaCO_3$, and CuO with a molar ratio of 2:4:5 was completely ground.
2. The mixture was heated at 950° C. in air for at least 24 hours with several intermediate grindings.
3. The heated mixture was cooled and ground, so that a powder with a nominal composition of $Sr_2Ca_4Cu_5O_{11}$ was obtained.
4. A mixture of $Tb_4O_7$, $Tl_2O_3$, and $Sr_2Ca_4Cu_5O_{11}$ with an atomic molar ratio of 1:1:2:4:5 (Tb:Tl:Sr:Ca:Cu) was ground and pressed into a pellet.
5. A tube furnace was heated to 950° C. in flowing oxygen.
6. The pellet was put in a platinum boat, and the boat was placed in the tube furnace, maintaining the temperature and oxygen flow for 3 minutes.
7. The pellet was then quenched in air to room temperature.

The samples prepared by this procedure were found to be superconducting above liquid nitrogen temperature. The dc resistance-temperature dependence for a sample prepared pursuant to this method is illustrated in FIG. 2 (curve Tb1).

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A composition having superconductive properties the composition comprising a melt produced complex having the nominal formula:

$$RTlSrCaCuO;$$

wherein R is chosen from the group consisting of La, Pr, Nd, Sm, Eu, Gd, Tb, Dy, Ho, Er, Tm, Yb, Lu and Y; and wherein the atomic molar ratio of R:Tl:Sr:Ca:Cu is 1:2:2:2:3.

2. A composition having superconductive properties having the following approximate stoichiometry:

$$RTl_xSr_yCa_zCu_uO_v$$

wherein:

R is a single rare earth metal is chosen from the group consisting of La, Pr, Nd, Sm, Eu, Gd, Tb, Dy, Ho, Er, Tm, Yb, Lu, and Y;

x is greater than 0.1 and less than 10;

y is greater than or equal to 0 and less than or equal to 10;

z is greater than or equal to 0 and les than or equal to 10;

y+z is greater than 0.1 and less than 20;

u is greater than 0.5 and less than 20; and v is greater than x+y+z+u and less than 5+x+y+z+u.

3. The composition of claim 2 wherein R is Pr.

4. The composition of claim 2 wherein R is Tb.

* * * * *